United States Patent
Wu et al.

(12) United States Patent (10) Patent No.: US 10,879,077 B2
(45) Date of Patent: Dec. 29, 2020

(54) PLANARIZATION APPARATUS AND PLANARIZATION METHOD THEREOF

(71) Applicant: TAIWAN SEMICONDUCTOR MANUFACTURING COMPANY LTD., Hsinchu (TW)

(72) Inventors: Ming-Tung Wu, Hsinchu (TW); Chun-Kai Lan, Hsinchu (TW); Tung-He Chou, Hsinchu (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 91 days.

(21) Appl. No.: 16/104,094

(22) Filed: Aug. 16, 2018

(65) Prior Publication Data

US 2019/0131148 A1    May 2, 2019

Related U.S. Application Data

(60) Provisional application No. 62/578,822, filed on Oct. 30, 2017.

(51) Int. Cl.
*H01L 21/306* (2006.01)
*H01L 21/67* (2006.01)
(Continued)

(52) U.S. Cl.
CPC ...... *H01L 21/30625* (2013.01); *B24B 37/015* (2013.01); *B24B 37/042* (2013.01);
(Continued)

(58) Field of Classification Search
CPC ......... B24B 37/046; B24B 37/16; C25F 3/12; C25F 7/00; H01L 21/30625
See application file for complete search history.

(56) References Cited

U.S. PATENT DOCUMENTS

| 4,652,275 A | 3/1987 | Bloecher et al. |
| 6,368,190 B1 * | 4/2002 | Easter ............ B24B 37/046 451/287 |

(Continued)

FOREIGN PATENT DOCUMENTS

| CN | 102886733 A | 1/2013 |
| CN | 107210211 A | 9/2017 |

(Continued)

OTHER PUBLICATIONS

Office Action and Search Report dated Nov. 25, 2019 issued by Taiwan Intellectual Property Office for counterpart application No. 105135591.

(Continued)

*Primary Examiner* — Nicholas A Smith
(74) *Attorney, Agent, or Firm* — WPAT, P.C., Intellectual Property Attorneys; Anthony King (57) ABSTRACT

A planarization apparatus is provided. The planarization apparatus includes a platen, and a grinding wheel. The platen is configured to support a wafer. The grinding wheel is over the platen and configured to grind the wafer. The grinding wheel includes a base ring, and a plurality of grinding teeth mounted on the base ring. The plurality of grinding teeth includes a plurality of grinding abrasives, and the plurality of grinding abrasives is ball type.

20 Claims, 12 Drawing Sheets

(51) Int. Cl.
*B24B 37/04* (2012.01)
*B24B 37/16* (2012.01)
*C25F 7/00* (2006.01)
*H01L 21/3063* (2006.01)
*C25F 3/12* (2006.01)
*B24B 37/015* (2012.01)
*H01L 21/304* (2006.01)

(52) U.S. Cl.
CPC ............ *B24B 37/046* (2013.01); *B24B 37/16* (2013.01); *C25F 3/12* (2013.01); *C25F 7/00* (2013.01); *H01L 21/304* (2013.01); *H01L 21/3063* (2013.01); *H01L 21/67086* (2013.01)

(56) References Cited

U.S. PATENT DOCUMENTS

| | | | | |
|---|---|---|---|---|
| 2001/0036746 | A1* | 11/2001 | Sato | B23H 5/08 438/745 |
| 2003/0062269 | A1* | 4/2003 | Sharan | B24B 37/046 205/656 |
| 2003/0216045 | A1* | 11/2003 | Wang | B23H 3/08 438/689 |
| 2006/0065633 | A1* | 3/2006 | Fischer | B24B 37/042 216/88 |
| 2009/0261437 | A1 | 10/2009 | Kang et al. | |
| 2010/0003904 | A1* | 1/2010 | Duescher | B24B 37/26 451/259 |
| 2013/0023188 | A1* | 1/2013 | Wei | B24D 7/14 451/41 |
| 2013/0062716 | A1 | 3/2013 | Li | |
| 2013/0331005 | A1* | 12/2013 | Gawase | B24B 53/017 451/56 |
| 2014/0364041 | A1* | 12/2014 | Choi | B24B 37/042 451/41 |
| 2015/0056722 | A1 | 2/2015 | Li et al. | |
| 2016/0064664 | A1 | 3/2016 | Dang et al. | |
| 2017/0076972 | A1* | 3/2017 | Krishnan | H01L 21/68785 |

FOREIGN PATENT DOCUMENTS

| | | | |
|---|---|---|---|
| DE | 69904074 | T2 | 3/1999 |
| JP | 10324865 | A * | 12/1998 |
| JP | 2005131779 | A * | 5/2005 |
| JP | 2005131779 | A | 5/2005 |
| JP | 2010040932 | A | 2/2010 |
| JP | 2014165339 | A * | 9/2014 |
| JP | 2014165339 | A | 9/2014 |
| JP | 2016182669 | A | 10/2016 |
| TW | 201601288 | | 1/2016 |

OTHER PUBLICATIONS

Office Action and Search Report dated Nov. 5, 2019 issued by China National Intellectual Property Administration for counterpart application No. 201811278785.3.

Office Action and Search Report dated Mar. 16, 2020 issued by Taiwan Intellectual Property Office for counterpart application No. 107138061.

* cited by examiner

PLANARIZATION APPARATUS AND PLANARIZATION METHOD THEREOF

PRIORITY CLAIM AND CROSS-REFERENCE

This application claims priority of U.S. provisional application Ser. No. 62/578,822 filed on 30 Oct. 2017, which is incorporated by reference in its entirety.

BACKGROUND

A back side of a silicon wafer is typically thinned to a certain thickness by grinding operation. Such grinding operation can thin down the thickness of the silicon wafer quickly but it will induce serious damage surface by the grinding wheel with diamond shape grits. After the grinding operation, the silicon wafer has high risks of leakage or edge crack. Therefore, there is a need to modify a planarization operation in order to improve the device performances as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, operations, elements, and/or components, but do not preclude the presence or addition of one or more other features, regions, integers, operations, elements, components, and/or groups thereof.

Furthermore, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, compounds, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "substantially" refers to the complete or nearly complete extent or degree of an action, characteristic, property, state, structure, item, or result. For example, a surface that is "substantially" coplanar with another surface would mean that these two surfaces are either completely located in the same plane or nearly completely located in the same plane. The exact allowable degree of deviation from absolute completeness may in some cases depend on the specific context. However, generally speaking the nearness of completion will be so as to have the same overall result as if absolute and total completion is obtained.

In some embodiments of the present disclosure, ball type grinding abrasives with substantially rounding perimeters is integrated into grinding teeth of a grinding wheel of a planarization apparatus. Hence, the damage to the surface of the wafer during grinding operation can be reduced, and capability of thinner thickness can be achieved. Due to damage less achievement, edge trimming operation can be skipped. In some embodiments of the present disclosure, an electrochemical etching reservoir is incorporated into the planarization apparatus to implement electrochemical etching during the grinding operation. The electrochemical etching may help to accelerate the removal rate of the wafer during the grinding operation.

Figure 1:
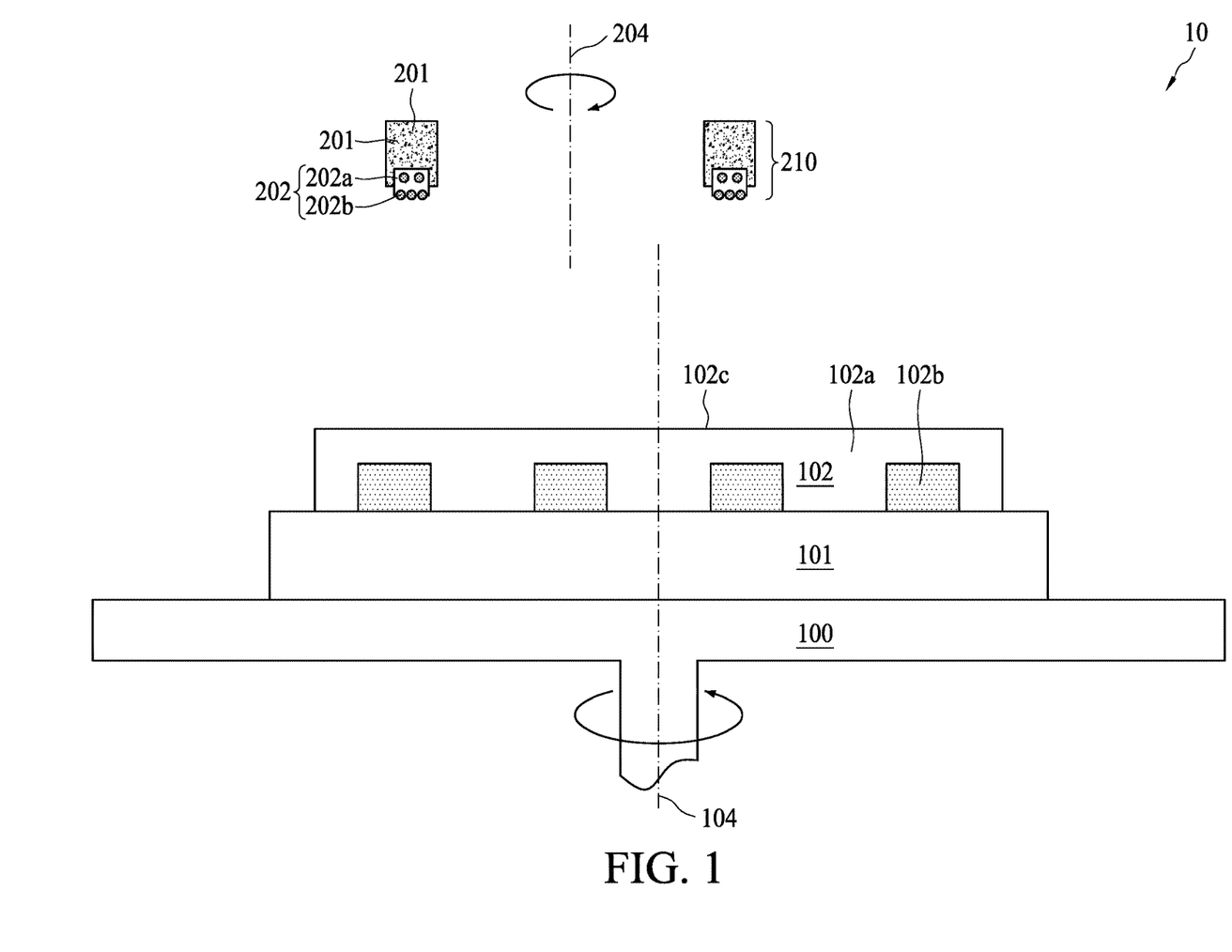
FIG. 1 illustrates a schematic cross-sectional view of a planarization apparatus in accordance with some embodiments of the present disclosure.

FIG. 1 illustrates a schematic cross-sectional view of a planarization apparatus 10 in accordance with some embodiments of the present disclosure. As shown in FIG. 1, the planarization apparatus 10 includes a platen 100, and a grinding wheel 210 disposed over the platen 100. In some embodiments, the platen 100 is configured to support one or more wafers 102. In some embodiments, the planarization apparatus 10 may include one or more chuck tables 101 over the platen 100, and configured to fix the wafer(s) 102. The numbers of the wafer 102 and the chuck table 101 may be the same such that each chuck table 101 may be used to fix a corresponding wafer 102. During grinding operation, the wafer 102 may be placed on the chuck table 101. In some embodiments, the chuck table 101 may hold the wafer 102 by vacuum, electrostatic charge (ESC) or the like. In some embodiments, the platen 100 can rotate about a first axis 104, and the grinding wheel 210 can rotate about a second axis 204 during grinding operation. The platen 100 and the grinding wheel 210 may be rotated in the same direction, or in different directions. In some embodiments, the chuck table 101 can rotate about the first axis 104 as well, but is not limited thereto. In some other embodiments, the platen 100 and the chuck table 101 may rotate about different axes. In some embodiments, the platen 100 may be vertically movable with respect to the grinding wheel 210 such that the grinding wheel 210 can be in contact with the wafer 102 for grinding.

In some embodiments, as shown in FIG. 1, the wafer 102 includes a semiconductor substrate 102a, such as a bulk semiconductor substrate. The bulk semiconductor substrate may include an elementary semiconductor, such as silicon; a compound semiconductor, such as silicon germanium, silicon carbide; or combinations thereof. In some embodiments, the wafer 102 includes several devices 102b such as circuitries, transistors, etc. disposed over or in the wafer 102. In some embodiments, the circuitries formed over or in the wafer 102 may be any type of circuitries suitable for a particular application. In some embodiments, the wafer 102 may include a CMOS substrate. In some embodiments, the wafer 102 may include a stacked wafer.

In some embodiments, as shown in FIG. 1, the wafer 102 may be grinded by the grinding wheel 210 from a back surface 102c to reduce the thickness and to planarize the back surface 102c of the wafer 102. In some embodiments, the grinding wheel 210 may be driven to rotate by a motor (not shown). In some embodiments, the grinding wheel 210 includes a base ring 201 and a plurality of grinding teeth 202. The base ring 201 may include a ring-shaped structure with a hollow region for heat dissipation and for removal of debris. In some embodiments, the grinding teeth 202 are mounted on the base ring 201 and facing the wafer 102. The plurality of grinding teeth 202 may include a plurality of grinding abrasives 202b.

Figure 1A:
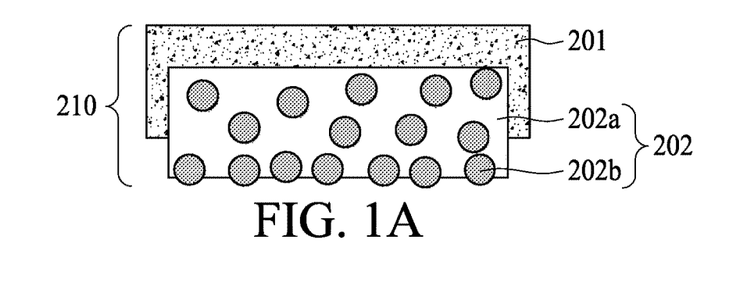
FIG. 1A is an enlarged cross-sectional view of a grinding wheel in accordance with some embodiments of the present disclosure.
Figure 1B:
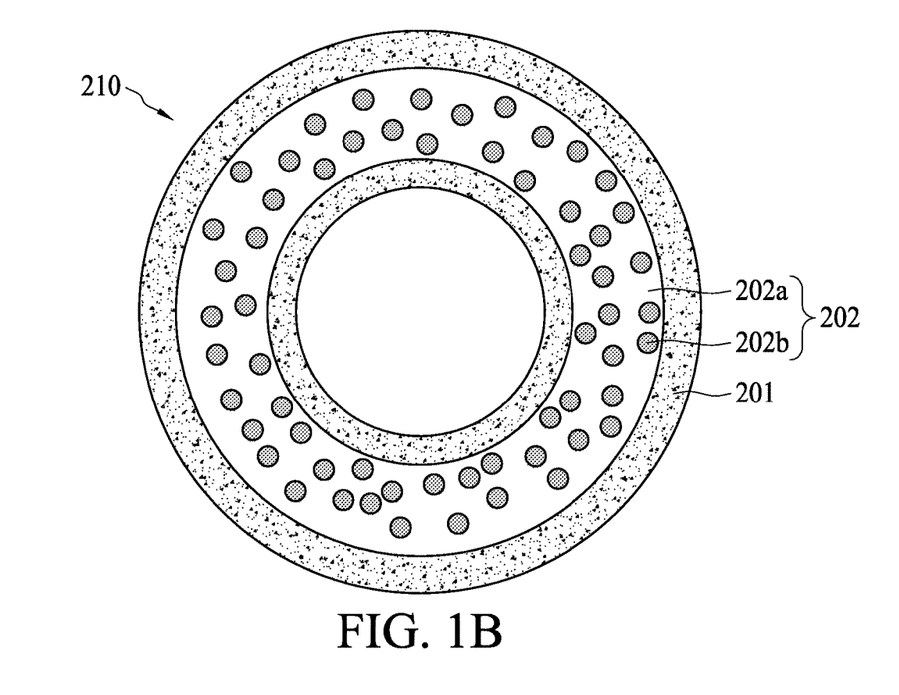
FIG. 1B is an enlarged top view of a grinding wheel in accordance with some embodiments of the present disclosure.

FIG. 1A is an enlarged cross-sectional view of a grinding wheel 210 in accordance with some embodiments of the present disclosure, and FIG. 1B is an enlarged top view of a grinding wheel 210 in accordance with some embodiments of the present disclosure. As shown in FIG. 1A and FIG. 1B, the grinding wheel 210 includes the base ring 201 and the plurality of grinding teeth 202 connected to the base ring 201. In some embodiments, the grinding tooth 202 may include a base material 202a and a plurality of grinding abrasives 202b dispensed in the base material 202a. In some embodiments, the base material 202a may include polymeric material, composite material or the like. The base material 202a may be configured as a molding layer to fix the grinding abrasives 202b. By way of example, the grinding abrasives 202b may be mixed in the base material 202a in the form of fluid. After solidification, the plurality of grinding abrasives 202b can be mounted within the base material 202a. The grinding abrasives 202b may be randomly or uniformly distributed in the base material 202a.

In some embodiments, the plurality of grinding abrasives 202b is ball type. The grinding abrasive 202b may have a substantially rounding perimeter. By way of examples, the plurality of grinding abrasives 202b may substantially have a spheroid shape, an oblate spheroid shape, a prolate spheroid shape, an ellipsoid shape, an oblate ellipsoid shape, a prolate ellipsoid shape or the like. In some embodiments, the plurality of grinding abrasives 202b has a smooth surface such that damage to the wafer 102 during grinding operation can be alleviated. In some embodiments, the plurality of grinding abrasives 202b has a Mohs hardness substantially equal to or greater than 9 to enhance grinding effect. The Mohs hardness of the ball type grinding abrasives 202b can be modified based on the material of the wafer 102 to be grinded. In some embodiments, the plurality of grinding abrasives 202b is made of metal ceramic composites. In some embodiments, the plurality of grinding abrasives 202b is made of corundum, tungsten carbide, silicon carbide (carborundum), titanium carbide, boron, boron nitride, rhenium diboride, stishovite, titanium diboride, diamond, carbonado or the like.

During grinding operation, the grinding wheel 210 can move vertically down toward the wafer 102 so that the grinding wheel 210 can be in contact with the back surface 102c of the wafer 102. The grinding wheel 210 and the wafer 102 can both be rotated during the grinding operation. In some embodiments, the grinding wheel 210 can rotate about the second axis 204, while the wafer 102 can be rotated along the first axis 104 with the platen 100. In some embodiments, the second axis 204 and the first axis 104 are substantially parallel with each other. The second axis 204 and the first axis 104 may be aligned or misaligned. In some embodiments, the rotation of the grinding wheel 210 about the second axis 204 and the rotation of the wafer 102 about the first axis 104 can be operated independently. In some embodiments, the grinding wheel 210 and the wafer 102 may rotate in the same direction or different directions. In some embodiments, the wafer 102 is rotated about the first axis 104 at a speed of between about 200 rpm and 4000 rpm. In some embodiments, the grinding wheel 210 is rotated about the second axis 204 at a speed of between about 200 rpm and 4000 rpm, but is not limited thereto.

In some other embodiments, the wafer 102 is disposed on the chuck table 101 (if exists), and the wafer 102 can be rotated about another axis such as a third axis (not shown) with the chuck table 101. In some embodiments, the rotation of the chuck table 101 and the rotation of the platen 100 can be operated independently. In some embodiments, the chuck table 101 is rotated about the third axis at a speed of between about 200 rpm and 4000 rpm, but is not limited thereto.

In some embodiments, the dimension such as diameter or length of the abrasive 202b is substantially ranging from about 25 μm to about 75 μm, e.g., 50 μm. The ball type grinding abrasive 202b has larger dimension and less acute surface than the diamond shape grit, and thus the grinding wheel 210, the platen 100 and the chuck table 101 can be rotated at a higher speed to reduce the time of grinding. Also, by virtue of the grinding abrasives 202b with larger dimension and smooth surface, the stress during grinding operation can be reduced, and capability of thinner thickness of the wafer 102 can be achieved.

Figure 2:
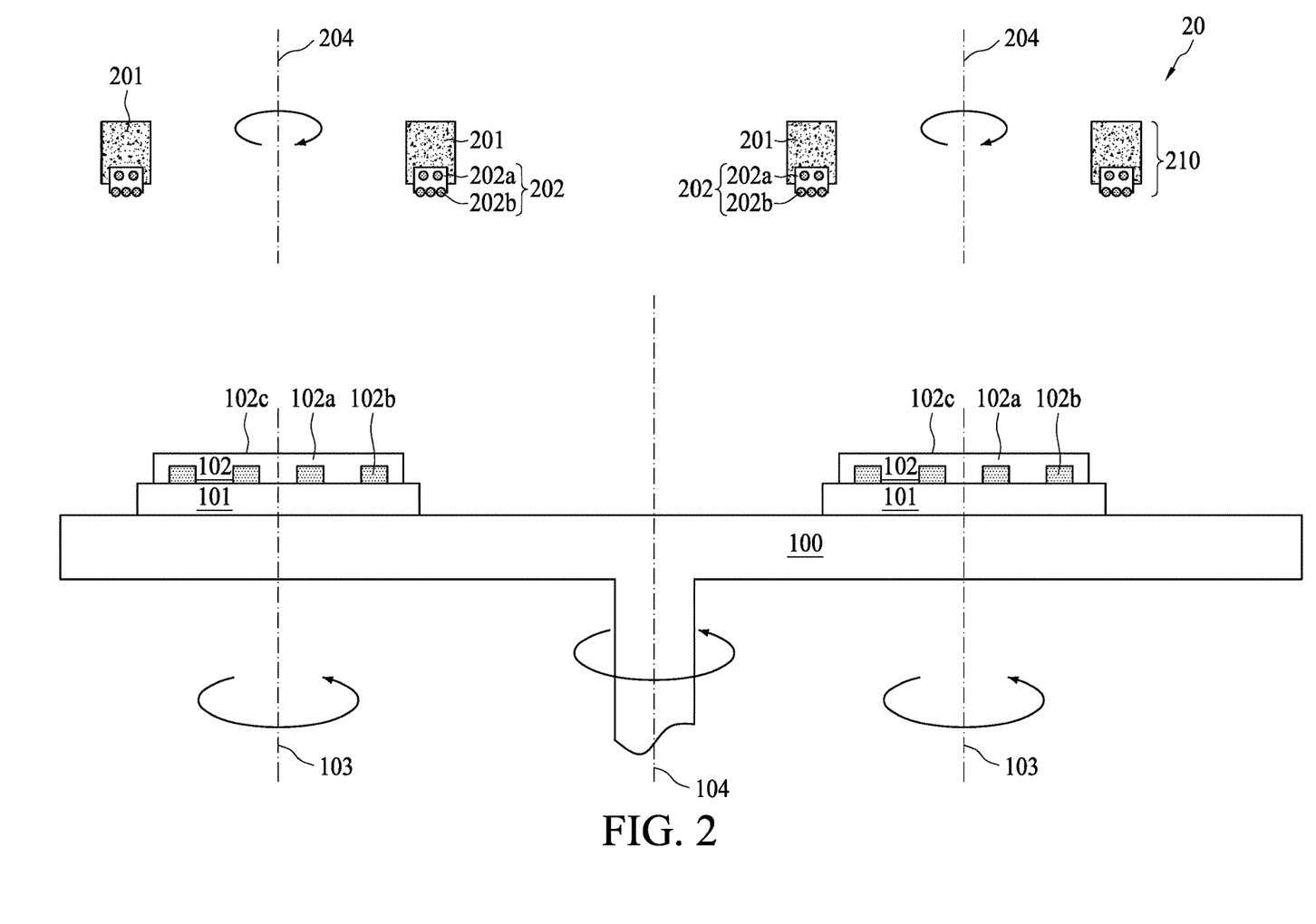
FIG. 2 illustrates a schematic cross-sectional view of a planarization apparatus in accordance with some embodiments of the present disclosure.

FIG. 2 illustrates a schematic cross-sectional view of a planarization apparatus 20 in accordance with some embodiments of the present disclosure. As shown in FIG. 2, the planarization apparatus 20 includes a platen 100 configured to support a plurality of wafers 102, and a plurality of grinding wheels 210 over the platen 100 and configured to grind the wafers 102. In some embodiments, a plurality of chuck tables 101 is disposed on the platen 100. In some embodiments, each of the chuck tables 101 is configured to hold a respective wafer 102. In some embodiments, the number of the chuck table 101 is not the same as the number of the plurality of grinding wheels 210. In some embodiments, the number of the chuck table 101 is less than the number of the plurality of grinding wheels 210. For example, the planarization apparatus 20 may have two chuck tables 101 and three grinding wheels 210, or four chuck tables 101 and five grinding wheels 210. In some embodiments, each of the chuck tables 101 is arranged asymmetrical with the rotation center of the platen 100. During the grinding operation, the platen 100 may be rotated about the first axis 104, each of the chuck tables 101 may be rotated about a third axis 103, and each of the grinding wheels 210 may be rotated about the second axis 204. The rotation of the platen 100 allows each of the wafers 102 fixed on the respective chuck table 101 to be grinded by the plurality of grinding wheels 210 in turn. While the platen 100 is rotated, each of the chuck tables 101 and each of the grinding wheels 210 are also rotated. When one of the wafers 102 is in contact with one of the grinding wheels 210, the wafer 102 can be grinded.

In some embodiments of the present disclosure, a planarization method is also disclosed. In some embodiments, a wafer is grinded by a method 300. The method 300 includes a number of operations and the description and illustration are not deemed as a limitation as the sequence of the operations.

Figure 3:
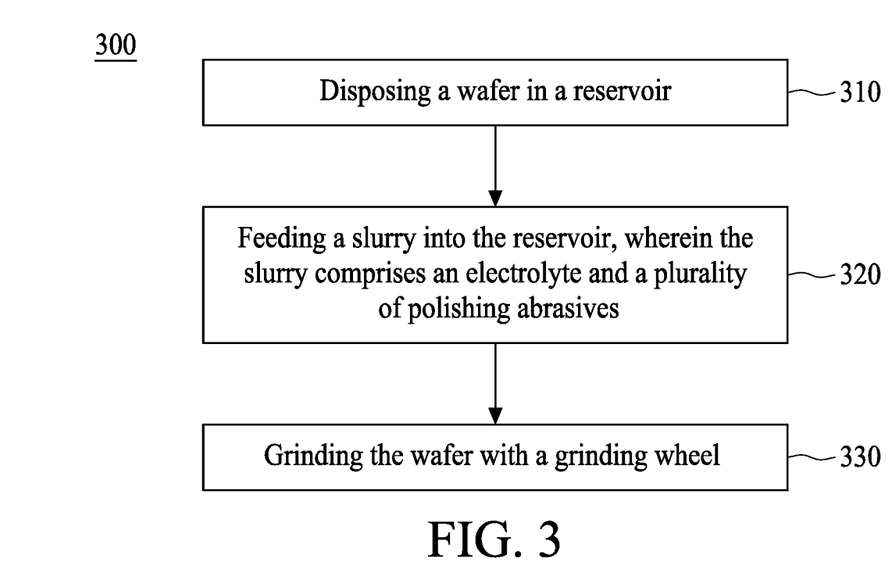
FIG. 3 is a flowchart illustrating a method for planarizing a wafer in accordance with various aspects of the present disclosure.

FIG. 3 is a flowchart illustrating a method for planarizing a wafer in accordance with various aspects of the present disclosure. The method 300 begins with operation 310 in which a wafer is disposed in a reservoir. The method 300 continues with operation 320 in which a slurry is fed into the reservoir, wherein the slurry comprises a plurality of polishing abrasives and an electrolyte. The method 300 proceeds with operation 330 in which the wafer is grinded with a grinding wheel.

Figure 4:
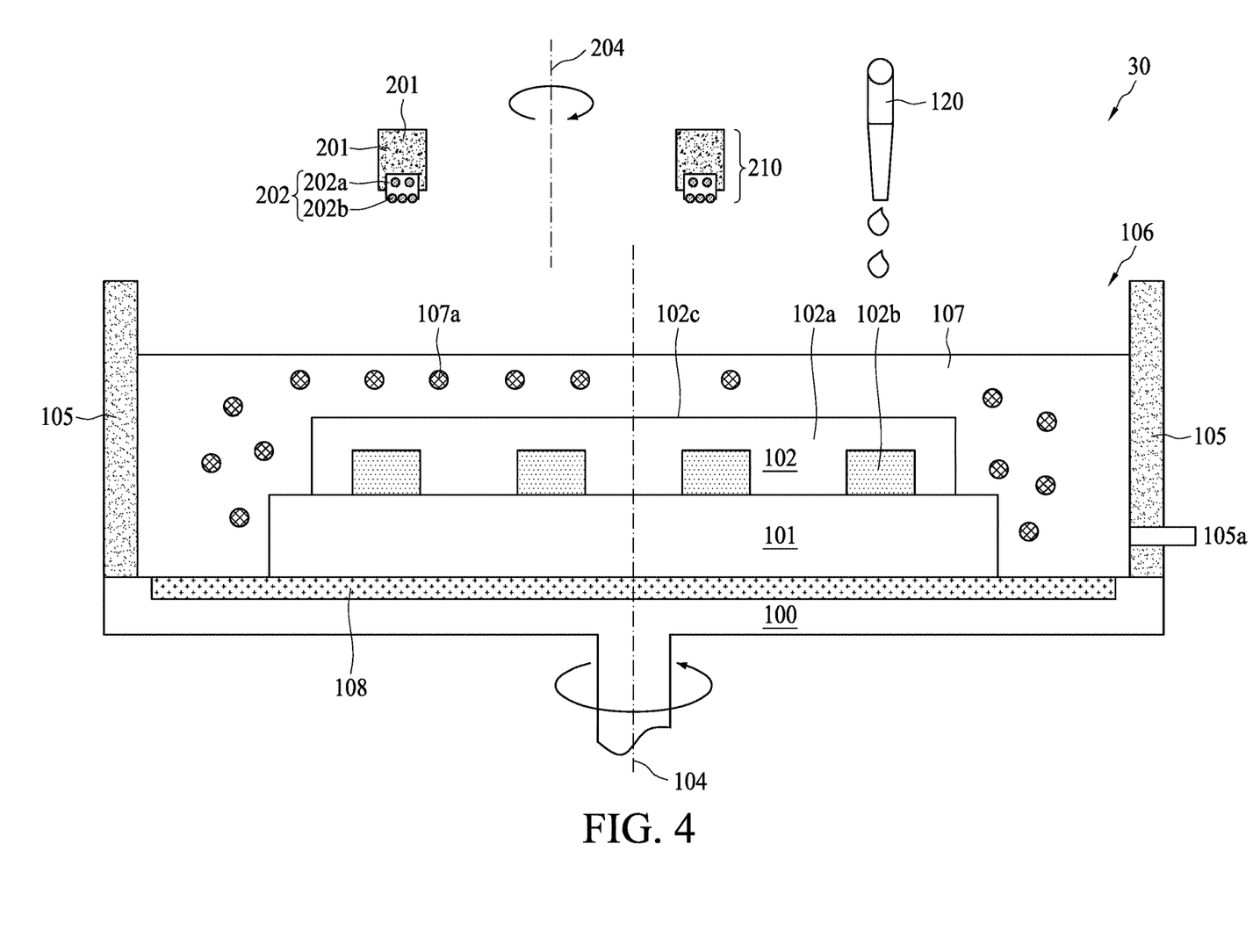
FIG. 4 illustrates a schematic cross-sectional view of a planarization apparatus in accordance with some embodiments of the present disclosure.

FIG. 4 illustrates a schematic cross-sectional view of a planarization apparatus 30 in accordance with some embodiments of the present disclosure. In some embodiments, the planarization apparatus 30 includes a platen 100 configured to support a wafer 102, and a grinding wheel 210 over the platen 100 and configured to grind the wafer 102. The planarization apparatus 30 has similar configuration as described above or illustrated in FIG. 1 of the planarization apparatus 10.

As shown in FIG. 4, the planarization apparatus 30 includes a frame 105 disposed on the platen 100. The frame 105 defines a reservoir 106 over the platen 100 for accommodating a slurry 107. In some embodiments, the slurry 107 may be fed into the reservoir 106 by a slurry introduction device 120.

In some embodiments, the slurry 107 includes a plurality of polishing abrasives 107a. In some embodiments, the plurality of polishing abrasives 107a is a ball type. In some embodiments, the plurality of polishing abrasives 107a may substantially have a spheroid shape, an oblate spheroid shape, a prolate spheroid shape, an ellipsoid shape, an oblate ellipsoid shape, a prolate ellipsoid shape or the like. In some embodiments, the plurality of polishing abrasives 107a has a smooth surface such that damage surface of the wafer 102 may be reduced. In some embodiments, the plurality of polishing abrasives 107a has a Mohs hardness substantially equal to or greater than 9. In some embodiments, the plurality of polishing abrasives 107a is made of metal ceramic composites. In some embodiments, the plurality of polishing abrasives is made of corundum, tungsten carbide, silicon carbide (carborundum), titanium carbide, boron, boron nitride, rhenium diboride, stishovite, titanium diboride, diamond, carbonado or the like.

In some embodiments, the slurry 107 further includes an alkaline solution. For example, the alkaline solution may include sodium hydroxide, potassium hydroxide, cerium hydroxide, rubidium hydroxide, ammonium hydroxide or the like. In some embodiments, the slurry 107 has pH value equal to or greater than 13. In some embodiments, the slurry has pH value in a range from about 13 to about 14. In some embodiments, the slurry 107 includes hydroxyl (OH—) which can accelerate a silicon etching. In some embodiments, the silicon can be etched by the following reactions: (1) oxidation of silicon by hydroxyl to form a silicate: $Si+2OH^-+4H^+ \rightarrow Si(OH)_2^{++}$; (2) reduction of water: $4H_2O \rightarrow 4OH^-+2H_2+4H^+$; and (3) silicate further reacts with hydroxyl to form a water soluble complex: $Si(OH)_2^{++}+4OH^- \rightarrow SiO_2(OH)_2^{2-}+2H_2O$. In some embodiments, the higher pH value of the slurry 107 results in higher hydroxyl concentration so as to obtain higher silicon etching rate. In some embodiments, the wafer 102 is grinded by the grinding wheel 210 while being electrochemically etched by the slurry 107.

During the grinding operation, the wafer 102 is immersed in the slurry 107. The grinding wheel 210 is moved downward with respect to the wafer 102 such that the ball type grinding abrasives 202b can be in contact with the wafer 102. In some embodiments, the ball type polishing abrasives 107a can also be in contact with the wafer 102 to help grind the wafer 102. The alkaline solution of the slurry 107 can also chemically etch the wafer while grinding the wafer 102.

In some embodiments, the planarization apparatus 30 may further include a drain valve 105a adjacent to the bottom of the frame 105. The drain valve 105a is configured to discharge the slurry 107 after the grinding operation.

In some embodiments, as shown in FIG. 4, the planarization apparatus 30 may further include a heater 108 configured to control the temperature of the slurry 107. In some embodiments, the higher temperature of the slurry 107 results in higher silicon etching rate. In some embodiments, the temperature of the slurry 107 can be controlled under the boiling point of the slurry 107. In some embodiments, the temperature of the slurry 107 can be controlled in a range from about 30° C. to about 120° C., but is not limited thereto. In some embodiments, the heater 108 may be disposed in the platen 100 or the chuck table 101 to uniformly heat the slurry 107.

In some embodiments of the present disclosure, a planarization method is also disclosed. In some embodiments, a wafer is grinded by a method 400. The method 400 includes a number of operations and the description and illustration are not deemed as a limitation as the sequence of the operations.

Figure 4A:
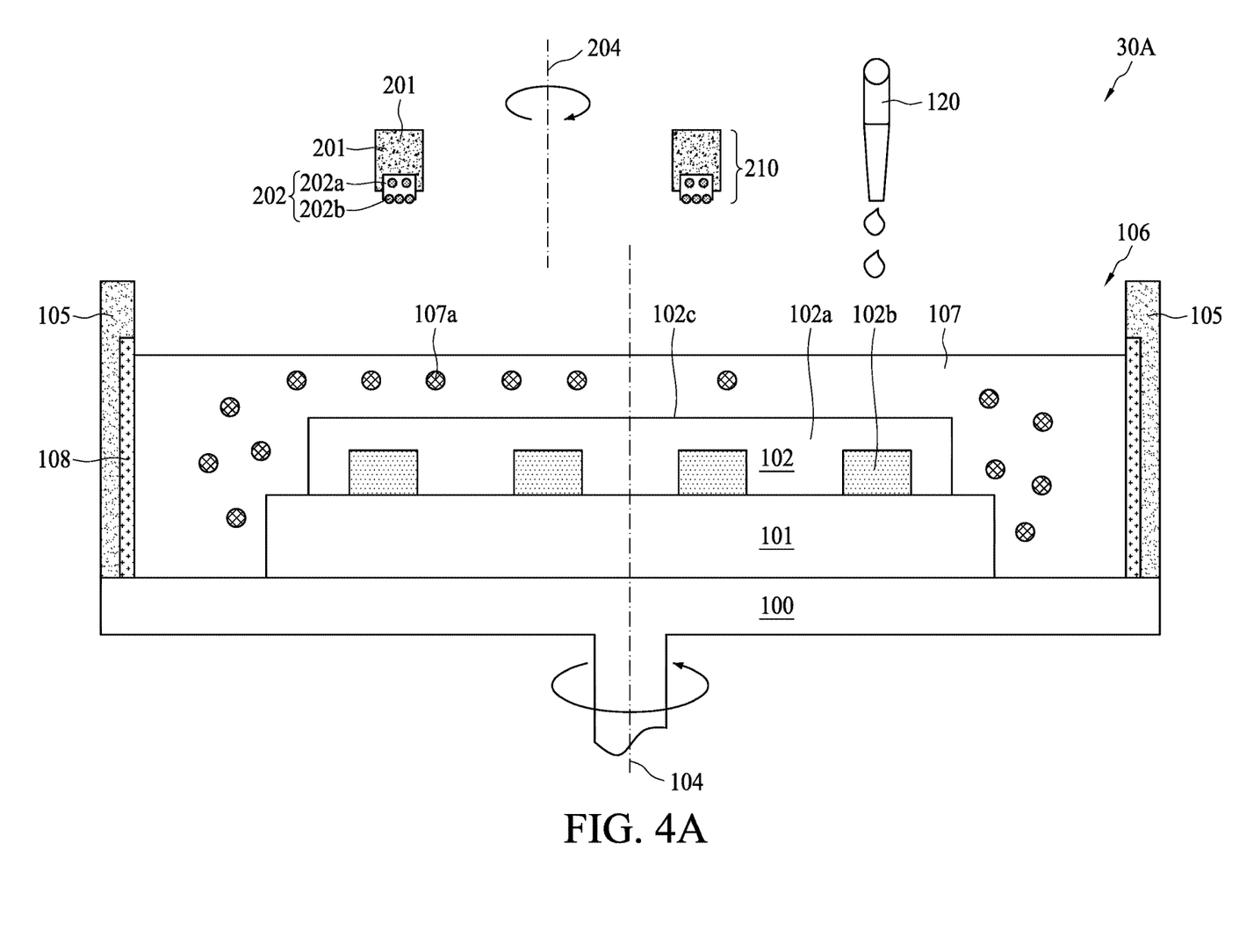
FIG. 4A illustrates a schematic cross-sectional view of a planarization apparatus in accordance with some embodiments of the present disclosure.

FIG. 4A illustrates a schematic cross-sectional view of a planarization apparatus 30A in accordance with some embodiments of the present disclosure. In some embodiments, the heater 108 of the planarization apparatus 30A may be disposed in the frame 105. By way of example, the heater 108 may surround the slurry 107 to uniformly heat the slurry 107.

Figure 4B:
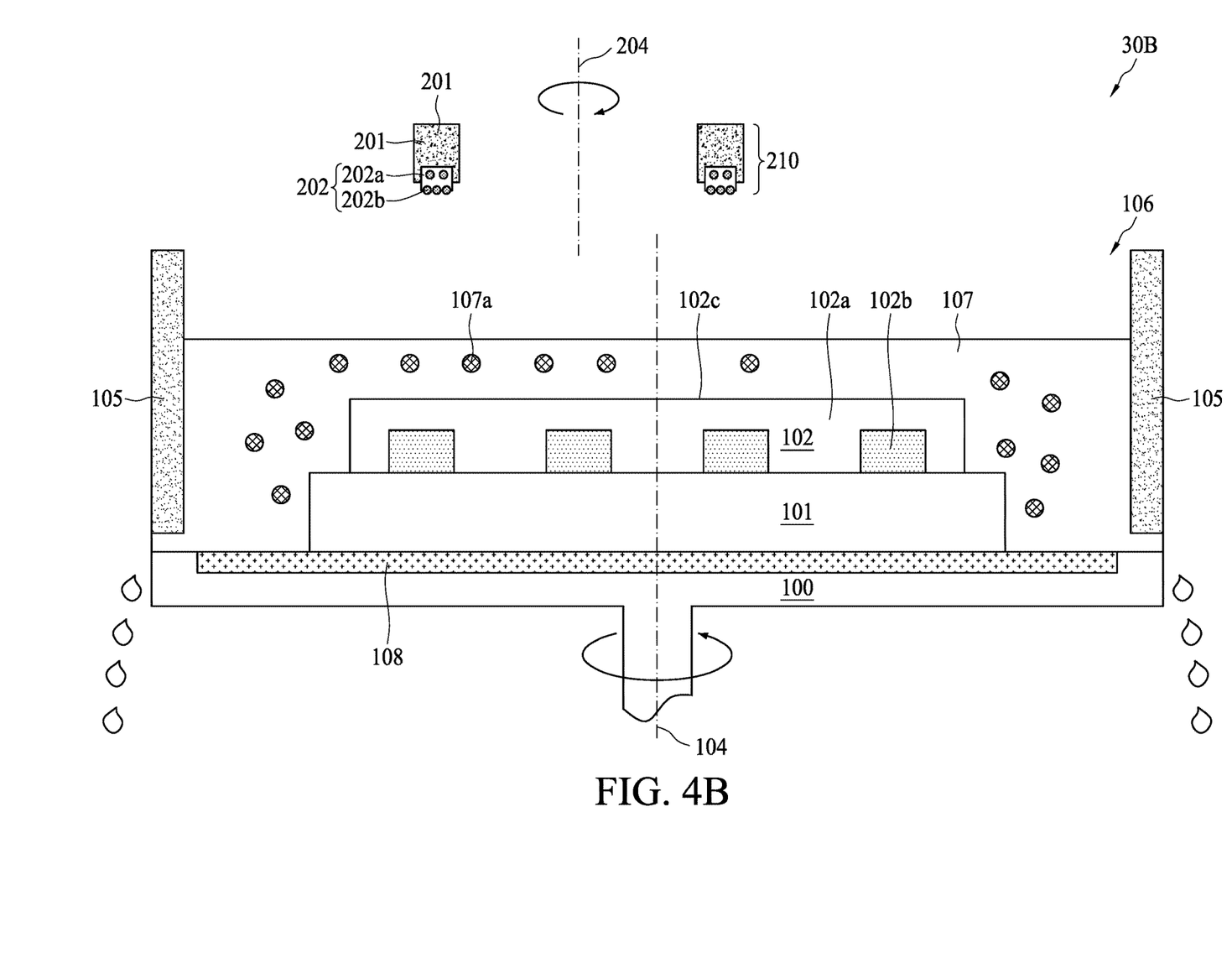
FIG. 4B illustrates a schematic cross-sectional view of a planarization apparatus in accordance with some embodiments of the present disclosure.

FIG. 4B illustrates a schematic cross-sectional view of a planarization apparatus 30B in accordance with some embodiments of the present disclosure. In some embodiments, the frame 105 may be moved upwardly or downwardly with respect to the platen 100 to drain the slurry 107 after the grinding operation.

Figure 5:
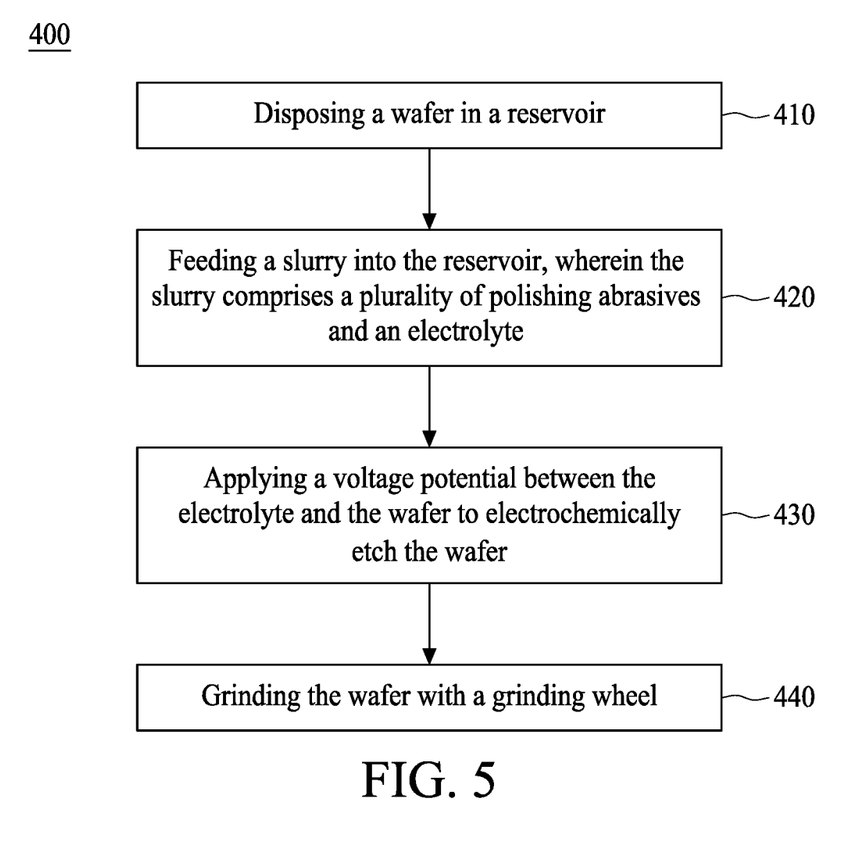
FIG. 5 is a flowchart illustrating a method for planarizing a wafer in accordance with various aspects of the present disclosure.

In some embodiments of the present disclosure, FIG. 5 is a flowchart illustrating a method 400 for planarizing a wafer in accordance with various aspects of the present disclosure. The method 400 begins with operation 410 in which a wafer is disposed in a reservoir. The method 400 continues with operation 420 in which a slurry is fed into the reservoir, wherein the slurry includes a plurality of polishing abrasives and an electrolyte. The method 400 proceeds with operation 430 in which a voltage potential is applied between the electrolyte and the wafer to electrochemically etch the wafer. The method 400 continues with operation 440 in which the wafer is grinded with a grinding wheel.

Figure 6:
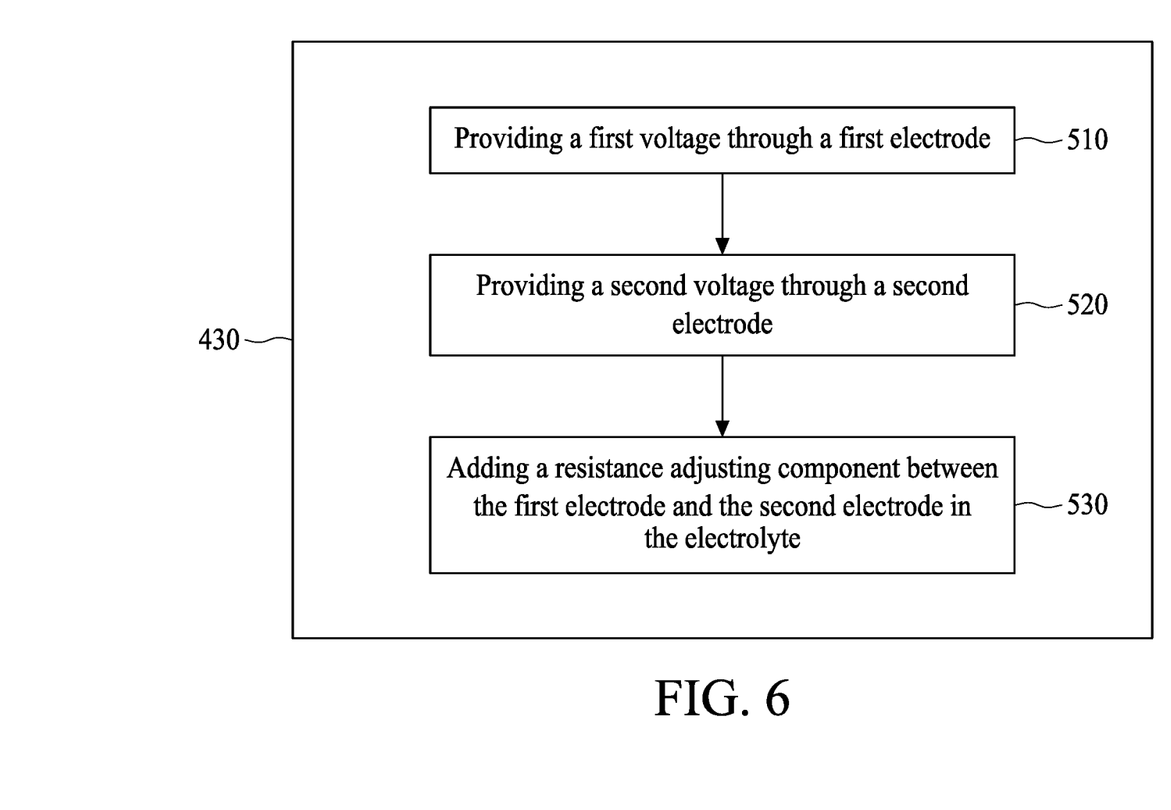
FIG. 6 is a flowchart illustrating a method for applying a voltage potential between the electrolyte and the wafer in accordance with various aspects of the present disclosure.

FIG. 6 is a flowchart illustrating a method for applying a voltage potential between the electrolyte and the wafer in accordance with various aspects of the present disclosure. As shown in FIG. 6, operation 430 of FIG. 5 may begin with sub-operation 510 in which a first voltage is provided through a first electrode. The operation 430 continues with sub-operation 520 in which a second voltage is provided through a second electrode. The operation 430 proceeds with sub-operation 530 in which a resistance adjusting component is added in the electrolyte between the first electrode and the second electrode.

Figure 7:
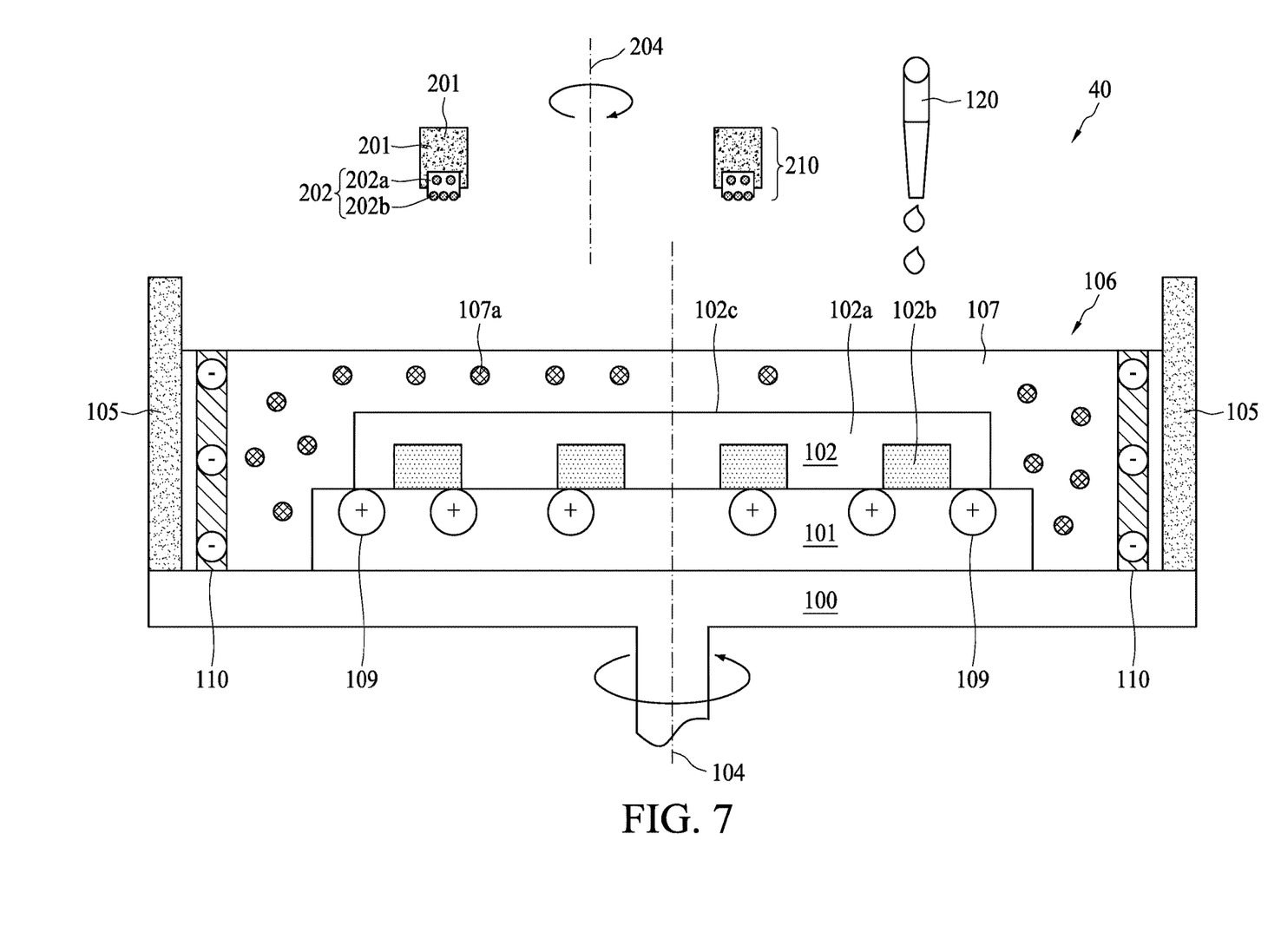
FIG. 7 illustrates a schematic cross-sectional view of a planarization apparatus 40 in accordance with some embodiments of the present disclosure.

FIG. 7 illustrates a schematic cross-sectional view of a planarization apparatus 40 in accordance with some embodiments of the present disclosure. As shown in FIG. 7, the planarization apparatus 40 further includes a first electrode 109 and a second electrode 110 configured to provide an electrical potential between the electrolyte and the wafer 102. The first electrode 109 may be in contact with the wafer 102, and the second electrode 110 may be in contact with the electrolyte. In some embodiments, the first electrode 109 is disposed in the platen 100 or in the chuck table 101, and under the wafer 102. In some embodiments, the first electrode 109 is an anode. In some embodiments, the second electrode 110 is disposed aside the wafer 102. The second electrode 110 may surround the wafer 102 such that the electrical potential may be uniformly formed across the reservoir 106. In some embodiments, the second electrode 110 is a cathode. In some embodiments, an electrode potential for the first electrode 109 is represented by $E_{anode}$ and the $E_{anode}$ is, but not limited to, 0.449 V at the condition of 25° C., 1 atm and pH 14. In some embodiments, an electrode potential for the second electrode 110 is represented by $E_{cathode}$ and the $E_{cathode}$ is, but not limited to, −0.907 V at the condition of 25° C., 1 atm and pH 14.

Figure 8:
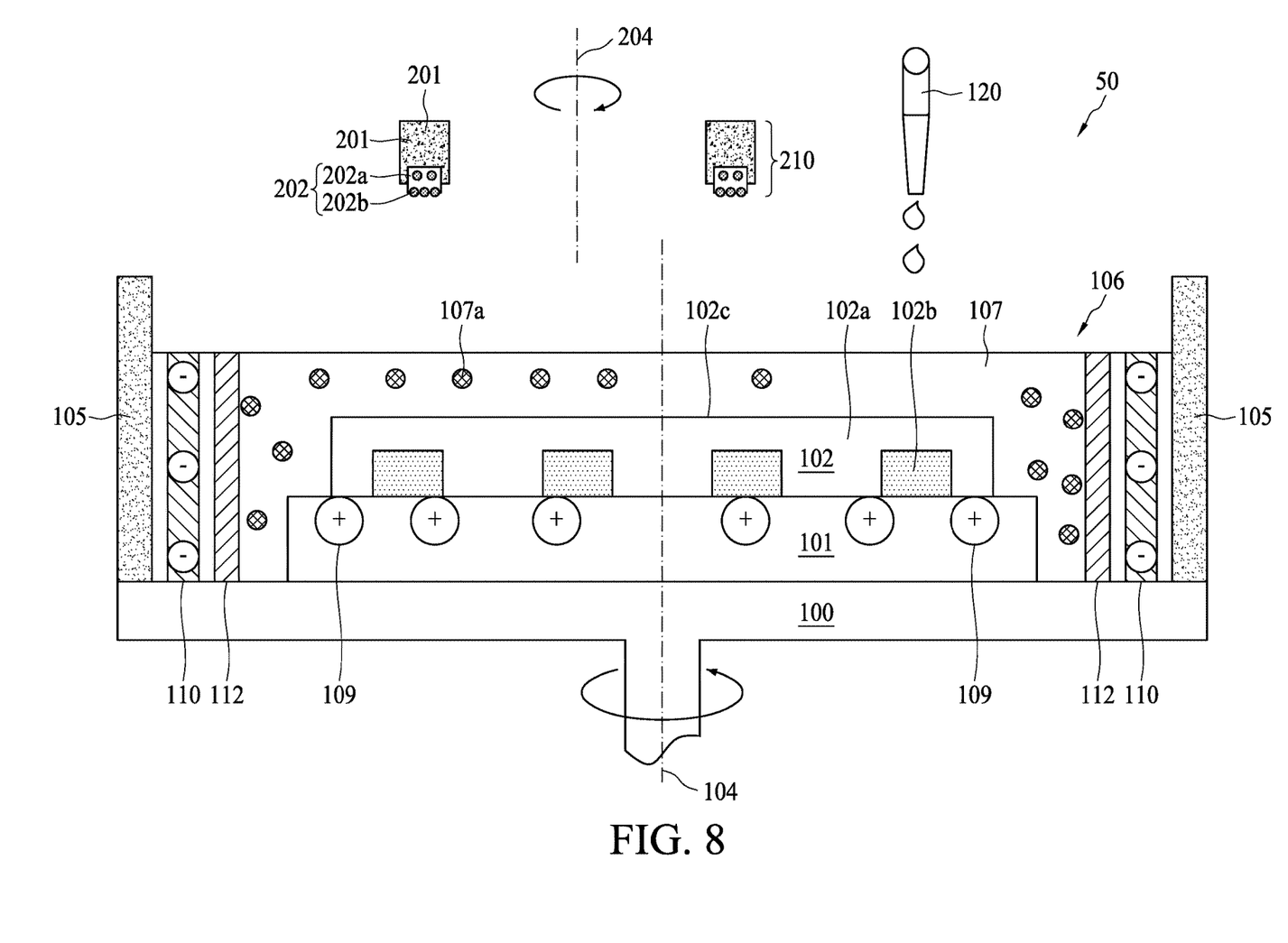
FIG. 8 illustrates a schematic cross-sectional view of a planarization apparatus in accordance with some embodiments of the present disclosure.

FIG. 8 illustrates a schematic cross-sectional view of a planarization apparatus 50 in accordance with some embodiments of the present disclosure. As shown in FIG. 8, the planarization apparatus 50 further includes a resistance adjusting component 112 disposed between the first electrode 109 and the second electrode 110. By way of example, the resistance adjusting component 112 may surround the wafer 102. In some embodiments, an electrical resistivity of the resistance adjusting component 112 is higher than the electrical resistivity of the wafer 102. In some embodiments, the electrical resistivity of the resistance adjusting component 112 is higher than the electrical resistivity of the slurry 107. The electrical resistivity of the resistance adjusting component 112 may be way higher than that of the wafer 102 and the slurry 107 such that the electrical resistivity of the wafer 102 and the slurry 107 can be ignored. Accordingly, the electrical potential across the wafer 102 may be more uniformly distributed, and electrochemically etching of the wafer 102 can be carried out more uniformly. In some embodiments, the ratio of the electrical resistivity of the resistance adjusting component 112 to that of the slurry 107 is greater than $10^{21}$, but is not limited thereto. In some embodiments, the resistance adjusting component 112 has an electrical resistivity in a range from about $10^{21}$ Ω·m to about $10^{23}$ Ω·m. In some embodiments, the slurry 107 has an electrical resistivity smaller than 0.2 Ω·m. In some embodiments, the resistance adjusting component 112 is an ion-permeable separator used to separate the first electrode 109 from the second electrode 110. In some embodiments, the resistance adjusting component 112 allows ions to pass through to implement electrochemical etching. In some embodiments, the resistance adjusting component 112 is a porous membrane which provides a physical barrier between the first electrode 109 and the second electrode 110. The porous membrane is open structure such as plastic meshes and provides a physical barrier between the first electrode 109 and the second electrode 110. The porous membrane may have pore sizes in the range from about 0.5 mm to about 12 mm. In some embodiments, the resistance adjusting component 112 is a microporous membrane which allows transporting ions. The microporous membrane has relatively small pore sizes in the range from about 0.1 μm to about 50 μm, but is not limited thereto. The microporous membrane may be made of porous ceramics and porous polymers. In some embodiments, the resistance adjusting component 112 is an ion exchange membrane which allows selective migration of ions. The ion exchange membrane may include fluorocarbon and hydrocarbon materials.

Figure 9:
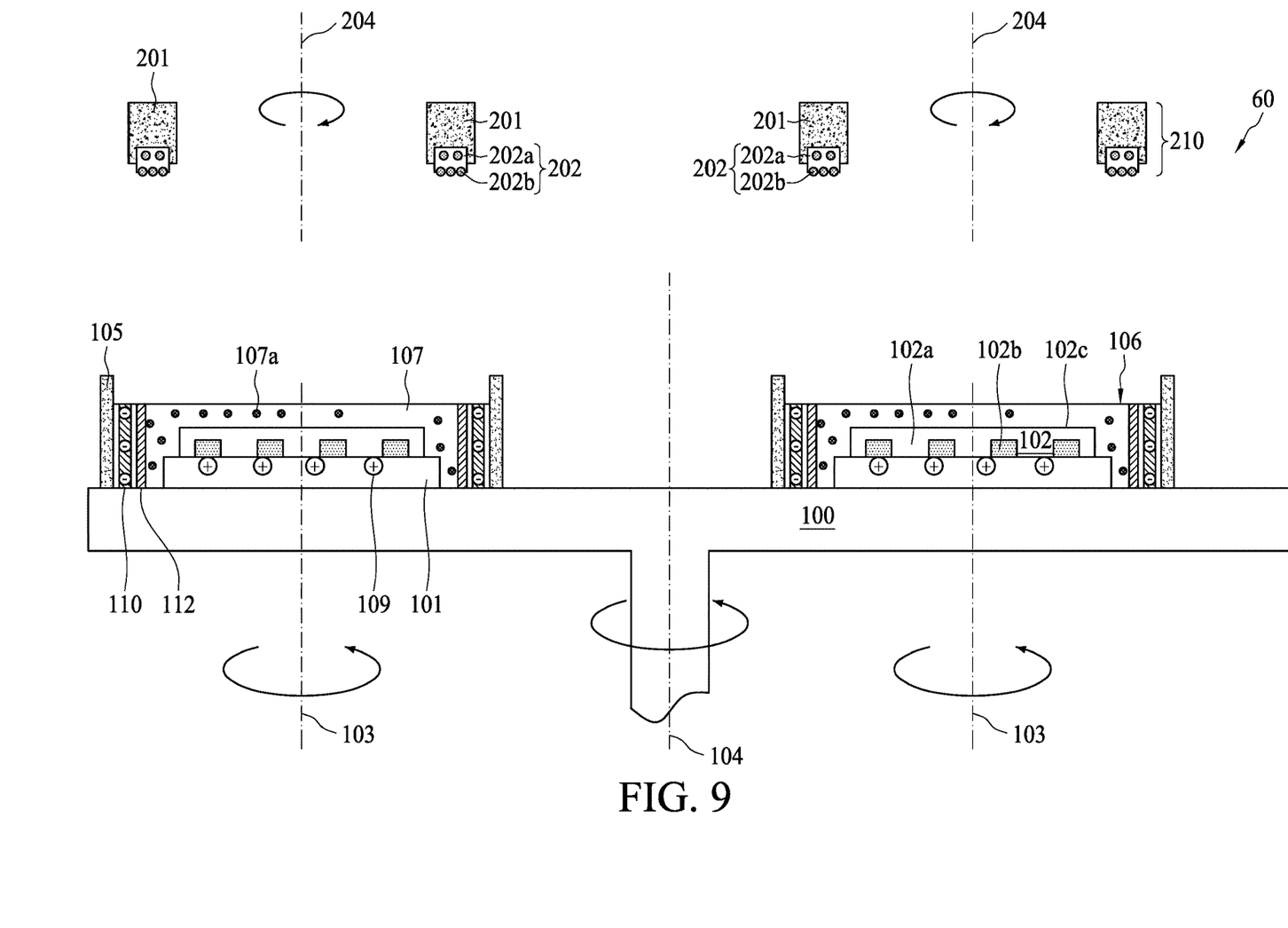
FIG. 9 illustrates a schematic cross-sectional view of a planarization apparatus in accordance with some embodiments of the present disclosure.

FIG. 9 illustrates a schematic cross-sectional view of a planarization apparatus 60 in accordance with some embodiments of the present disclosure. As shown in FIG. 9, the planarization apparatus 60 may include a plurality of chuck tables 101, a plurality of grinding wheels 210 and a plurality of frames 105 over the platen 100. Each of the frames 105 is disposed on the platen 100, and defines a reservoir 106 for accommodating a set of slurry 107, chuck table 101, wafer 102, first electrode 109, second electrode 110 and resistance adjusting component 112.

In some embodiments of the present disclosure, the planarization apparatus includes a grinding wheel with ball type grinding abrasives to alleviate surface damage to the wafer during the grinding operation. In some embodiments of the present disclosure, the planarization apparatus further includes an electrochemical etching reservoir for electrochemical etching the wafer during the grinding operation. The electrochemical etching may help to accelerate the removal rate of the wafer during the grinding operation. In some embodiments of the present disclosure, ball type polishing abrasives may be added in the slurry in the reservoir to alleviate surface damage to the wafer during the grinding operation.

In some embodiments of the present disclosure, a planarization apparatus is provided. The planarization apparatus includes a platen, and a grinding wheel. The platen is configured to support a wafer. The grinding wheel is over the platen and configured to grind the wafer. The grinding wheel includes a base ring, and a plurality of grinding teeth mounted on the base ring. The plurality of grinding teeth includes a plurality of grinding abrasives, and the plurality of grinding abrasives is ball type.

In some embodiments of the present disclosure, a planarization apparatus is provided. The planarization apparatus includes a platen, a frame and a grinding wheel. The platen is configured to support a wafer. The frame is disposed on the platen. The frame surrounds the wafer, and defines a reservoir over the platen for accommodating a slurry. The grinding wheel is over the platen and configured to grind the wafer.

In some embodiments of the present disclosure, a planarization method is provided. The planarization method includes disposing a wafer in a reservoir, feeding a slurry into the reservoir, wherein the slurry comprises an electrolyte and a plurality of polishing abrasives, applying a voltage potential between the electrolyte and the wafer to electrochemically etch the wafer, and grinding the wafer with a grinding wheel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A planarization apparatus, comprising:
a platen configured to support a wafer; and
a grinding wheel over the platen and configured to grind the wafer, the grinding wheel comprising:
a base ring; and
a plurality of grinding teeth mounted on the base ring, the plurality of grinding teeth comprising a base material and a plurality of grinding abrasives, wherein the plurality of grinding abrasives is ball type, and the grinding abrasives are dispensed in and fixed in the base material to grind the wafer;
a reservoir over the platen for accommodating a slurry comprising an electrolyte; and
a first electrode and a second electrode configured to provide an electrical potential between the wafer and the electrolyte to electrochemically etch the wafer.

2. The planarization apparatus of claim 1, wherein a Mohs hardness of the plurality of grinding abrasives is substantially equal to or greater than 9.

3. The planarization apparatus of claim 1, further comprising a chuck table over the platen, and configured to fix the wafer.

4. The planarization apparatus of claim 3, wherein the platen and the chuck table are rotatable about different axes.

5. The planarization apparatus of claim 1, further comprising a resistance adjusting component in the electrolyte, and between the first electrode and the second electrode.

6. The planarization apparatus of claim 5, wherein the resistance adjusting component comprises a porous membrane.

7. A planarization apparatus, comprising:
a platen configured to support a wafer;
a frame disposed on the platen, wherein the frame surrounds the wafer, defining a reservoir over the platen for accommodating a slurry comprising an electrolyte;
a grinding wheel over the platen and configured to grind the wafer, wherein the grinding wheel comprises:
a base ring; and
a plurality of grinding teeth mounted on the base ring, the plurality of grinding teeth comprising a plurality of grinding abrasives, wherein the plurality of grinding abrasives is ball type, and the grinding abrasives are fixed to the base ring; and
a first electrode and a second electrode configured to provide an electrical potential between the wafer and the electrolyte, wherein the first electrode is disposed under the wafer, and the second electrode is disposed aside the wafer.

8. The planarization apparatus of claim 7, wherein the slurry comprise an alkaline solution.

9. The planarization apparatus of claim 7, wherein the first electrode is in contact with the wafer and the second electrode is in contact with the electrolyte.

10. The planarization apparatus of claim 7, further comprising a resistance adjusting component in the electrolyte, and between the first electrode and the second electrode, wherein a resistance of the resistance adjusting component is higher than that of the wafer.

11. The planarization apparatus of claim 10, wherein the resistance adjusting component comprises a porous membrane.

12. The planarization apparatus of claim 10, wherein the resistance adjusting component surrounds the wafer.

13. The planarization apparatus of claim 7, further comprising a heater configured to heat the slurry.

14. The planarization apparatus of claim 7, further comprising a chuck table over the platen, and configured to fix the wafer.

15. The planarization apparatus of claim 14, wherein the platen and the chuck table are rotatable about different axes.

16. The planarization apparatus of claim 7, wherein the slurry comprises a plurality of polishing abrasives, and the plurality of polishing abrasives is ball type.

17. The planarization apparatus of claim 7, wherein the first electrode is disposed in the platen.

18. A planarization method, comprising:
disposing a wafer in a reservoir;
feeding a slurry into the reservoir, wherein the slurry comprises an electrolyte and a plurality of polishing abrasives, and the grinding wheel comprises a plurality of ball type grinding abrasives;
applying a voltage potential between the electrolyte and the wafer to electrochemically etch the wafer; and
grinding the wafer with a grinding wheel.

19. The planarization method of claim 18, wherein the wafer is grinded while electrochemically etching the wafer.

20. The planarization method of claim 18, wherein the applying the voltage potential between the electrolyte and the wafer comprises:
providing a first voltage to the wafer through a first electrode;

providing a second voltage to the electrolyte through a second electrode; and adding a resistance adjusting component between the first electrode and the second electrode in the electrolyte.

\* \* \* \* \*